United States Patent [19]

Beer et al.

[11] Patent Number: 4,956,747

[45] Date of Patent: Sep. 11, 1990

[54] MULTIPLE SIGNAL TRANSMISSION DEVICE

[75] Inventors: Dieter Beer, Mösbach/Feldkahl; Horst Reddehase, Detmold; Siegfried Kerbstat, Detmold; Detlef Hanning, Augustdorf; Ulrich Plass; Hermann Krause, both of Detmold, all of Fed. Rep. of Germany

[73] Assignee: C. A. Weidmüller GmbH & Co., Fed. Rep. of Germany

[21] Appl. No.: 421,128

[22] Filed: Oct. 13, 1989

[30] Foreign Application Priority Data

Oct. 18, 1988 [EP] European Pat. Off. ........... 88117313

[51] Int. Cl.⁵ .............................................. H05K 7/00
[52] U.S. Cl. ...................... 361/392; 361/331; 361/417; 361/419; 361/420; 361/429; 439/716; 439/717
[58] Field of Search ........ 361/331, 332, 380, 392–393, 361/396, 417, 419, 420, 426, 428, 429; 439/715–717

[56] References Cited

U.S. PATENT DOCUMENTS 4,477,862 10/1984 Gonzales ............................. 361/380
4,738,632 4/1989 Schmidt et al. ..................... 361/393

FOREIGN PATENT DOCUMENTS 0004507 11/1981 European Pat. Off. .
3603750 8/1987 Fed. Rep. of Germany .

OTHER PUBLICATIONS

Weidmüller, "Moduplex Mehrfachübertragungssystem", 4/85.

Primary Examiner—Gregory D. Thompson
Attorney, Agent, or Firm—Laubscher, Presta & Laubscher

[57] ABSTRACT

A multiple signal transmission unit includes input/output modules having top and bottom portions which are connected electrically and mechanically via a plug connection. The bottom portions are designed exclusively for the current supply of the neighboring module of a line of modules by spring contacts which pass through the bottom portions from lineup side to lineup side. These modules are in contact connection from bottom portion to bottom portion via the spring contacts, while all elements of the circuit are associated with the top portions for the control of the machines, subassemblies, and the like that are connected with the modules.

10 Claims, 2 Drawing Sheets

MULTIPLE SIGNAL TRANSMISSION DEVICE

BACKGROUND OF THE INVENTION

The present invention relates to a multiple signal transmission device including a transmitter or receiver, which can be supplied with power from a grid, and input or output modules. The modules include a bottom portion which can be mounted on and lined up with a carrier rail and an upper portion electrically connected with the bottom portion via a plug connection, whereby the bottom portions of adjacent modules can be electrically connected with each other.

BRIEF DESCRIPTION OF THE PRIOR ART

Multiple signal transmission devices, where the input/output elements comprise modules that can be lined up with each other and that can also be connected electrically, are well-known in the prior art. For example, the Weiduller Prospectus Sheet "Moduplex 08.929/4/85" dating back to April 1985 discloses modular switching and control elements mounted on carrier rails. In order to conduct the supply voltage and provide other control functions to the modules and from one module to the next, there are provided plug connections including a plug connector, a socket, and a flat-strip cable connector.

The plug connections between input/output modules arranged in a row are rather awkward and make the modules difficult to handle, particularly where a long series of modules are connected with a transmitter/receiver for controlling electrical equipment. Moreover, during maintenance on a particular module or replacement of a module, the modules which follow the defective module must be disconnected from the power supply, owing to the series connection between the modules, so that the electrical equipment under control of the modules is subjected to unnecessary down time.

In the published German patent application No. DE 36 03 750 A1 there is disclosed an automation control unit having a plurality of modules which are subdivided into upper and lower portions which are mechanically and electrically interconnected via a plug connection. The lower portions of the modules are mounted on carrier rails and are electrically connected with the adjacent module lower portions via plug connections in a manner similar to prior Weidmuller modules discussed above. These devices therefor suffer from the same drawbacks in that repair or alteration of any module results in the subsequent modules being disconnected from the power supply.

Another drawback of the prior devices is that the connecting elements for external wiring are associated with the module bottom portions. European Patent No. 0,004,501 B1 discloses a comparable multiple signal transmission unit provided with bus bars that serve exclusively for current supply. This solution is extremely laborious with respect to assembly, maintenance, and repair because separate through-going bus bars are provided under which there is provided a bottom portion for the modules which carries a complex current conducting device and connections for external wiring, while a multipart upper module portion is mounted via the top side of the bus bars. The arrangement of the connections for the external wiring in the bottom portion thus also entails the aforementioned problems in this area. If necessary, the upper portions of the modules and the associated circuitry can be removed without interrupting the current conduction. During maintenance and repair work in the foundation area below the through-going bus bars, the entire arrangement must be removed and taken apart. Because of the requirement for attaching the bottom portions under the through-going bus bars, there is no longer a flexible structural system wherein input/output modules can be lined up on a carrier rail without any problems.

The present invention was developed in order to overcome these and other drawbacks of the prior devices by providing a multiple signal transmission device which, during maintenance, alteration, or repair work on one of the modules thereof, will guarantee the continued supply of current to all of the other modules in line on the carrier rail. The device is structurally simple and easy to handle regarding interconnection of a plurality of modules in a line as well as maintenance and repair of individual modules.

SUMMARY OF THE INVENTION

Accordingly, it is a primary object of the present invention to provide a multiple signal transmission device for controlling equipment including a transmitter/receiver connected with a carrier rail and at least one input/output module connected with the transmitter receiver for transferring control signals relative to the equipment. Each module includes a bottom portion connected with the carrier rail and a top portion electrically connected with the bottom portion via a plug connection. Electrical contacts are connected with the module bottom portion for electrically connecting the adjacent module bottom portions to provide current to the modules and data transfer therebetween. The electrical contacts are also connected with the plug connection to supply current and transfer data relative to the module top portion.

The contacts comprise spring contacts which pass through the module bottom portion between the line-up connection sides thereof. The end portions of each spring contact are configured to abut against the adjoining contact of an adjacent module bottom portion to provide an electrical connection therebetween.

Each module bottom portion includes upper and lower insulated sections. At each side thereof, the upper section contains a contact chamber and the lower section includes a protrusion. As the insulated sections are assembled with the spring contacts therebetween, the lower section protrusions press the contact end portions into the upper section chambers, whereby the contact end portions are maintained in an erect position without diminishing their elasticity.

BRIEF DESCRIPTION OF THE FIGURES

Other objects and advantages of the invention will become apparent from a study of the following specification when viewed in the light of the accompanying drawing, in which.

DETAILED DESCRIPTION

Figure 1:
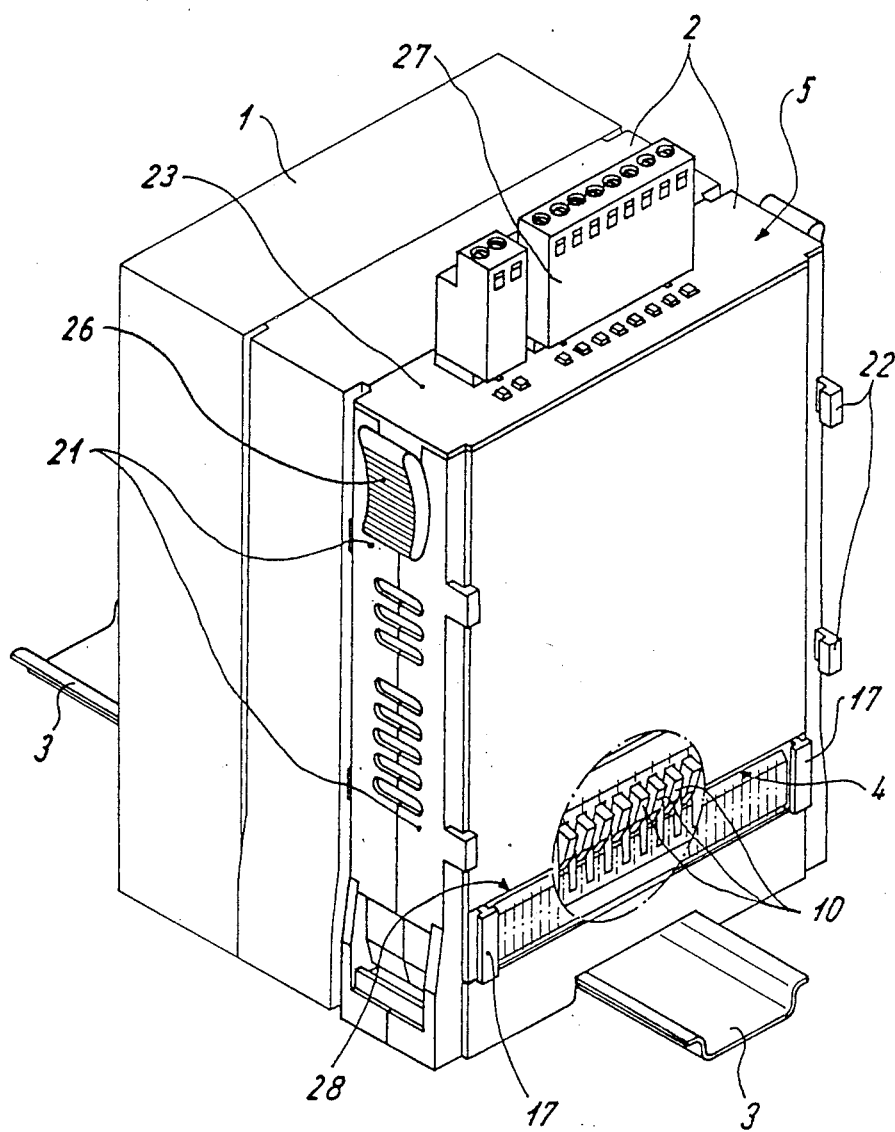
FIG. 1 is a perspective view of the multiple signal transmission device according to the invention and including two input/output modules.

Referring first to FIG. 1, the multiple signal transmission device according to the invention will be described. The device includes a transmitter or receiver 1 which can be supplied with power from a grid as well as a set of input or output modules 2 in accordance with the particular number of machines, equipment, and the like to be controlled. The transmitter/receiver 1 and the corresponding modules are placed in line on carrier rail 3.

The individual modules include a bottom portion 4 and a top or upper portion 5 which are interconnected both electrically and mechanically via a plug connection. According to the invention, the bottom portions 4 of the modules 2 are designed for the passage of the current supply and a data transfer within a corresponding module line of the multiple signal transmission unit. Moreover, the modules are designed so that the current supply of all modules of the line is maintained even if an upper portion 5, which contains the circuitry for the control of the equipment involved, is removed from one module 2 of a series for the purpose of maintenance or repair.

Figure 2:
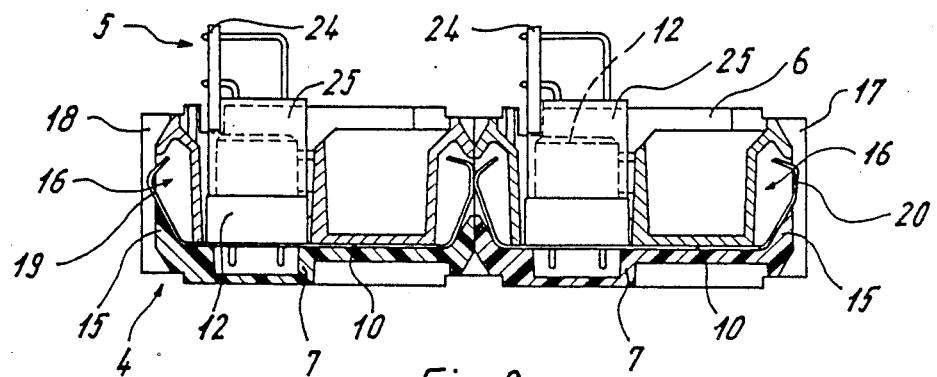
FIG. 2 is a vertical sectional view through the bottom portions of two adjacent lined-up modules of the invention.
Figure 3:
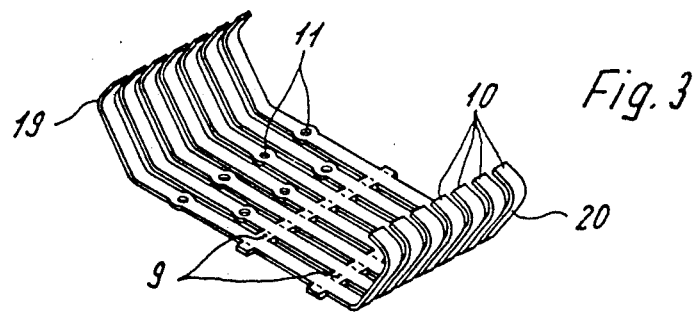
FIG. 3 is a perspective view of the spring contact assembly of the invention.
Figure 4:
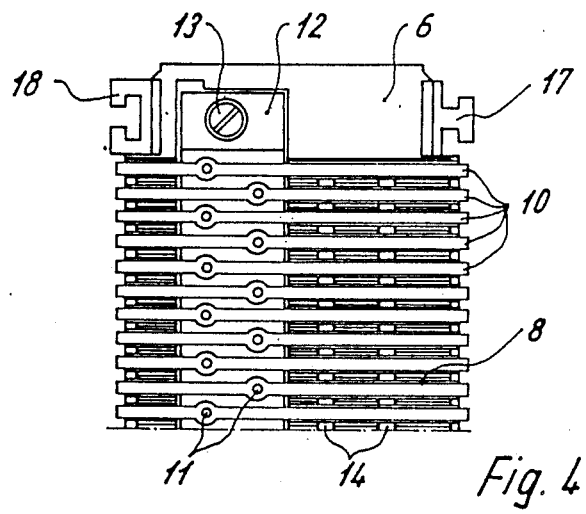
FIG. 4 is a bottom view of an upper insulating section of one of the module bottom portions of FIG. 2.

Referring now to FIGS. 2–4, the bottom portions 4 of the modules 2 are each provided with an electrical contact assembly, preferably of spring contacts. On the two lineup sides of the bottom portion 4, the ends of the spring contacts protrude so that when the bottom portions 4 are lined up on the carrier rail 3, a contact connection of all of the bottom portions 4 of all of the modules 2 into one line will be created.

More particularly, the bottom portion 4 comprises an upper insulating section 6 as well as a lower insulating section 7. On the underside of the upper insulating section 6, there are provided chamber-like depressions or recesses 8 as shown in FIG. 4. During assembly, a spring contact assembly comprising individual contact springs 10 which are interconnected via ties or studs 9 is inserted into the recesses 8. The individual contact springs 10 of the spring contact assembly are connected via soldering points 11 with a socket bar 12 that is arranged in the upper insulating section 6 as shown in FIGS. 2 and 4. Other known connection techniques might also be used. Socket bar 12, together with the set of spring contacts 10, is fastened by means of screws 13 to the upper insulating section 6 and provides a plug connection with the module top portion 5 as will be developed below. In place of the screw fasteners, a snap connection can be employed.

In the upper insulating section 6, there are furthermore provided small projections 14 through which the studs 9 are punched out during the assembly phase of the module bottom portion. Owing to this type of assembly, one can make sure that the predetermined screen pattern and the predetermined position of the individual spring contacts 10, especially their parallel nature with respect to each other, will not be altered during the assembly and connection processes.

Finally, the lower insulating section 7 is positioned in a properly fitting manner with the help of a centering device provided on both parts, and it is firmly connected with the upper insulating section 6, such as for example, by gluing or welding.

In another practical design, the lower insulating section 7 has a pair of protrusions 15 which are designed comb-like and which engage contact chambers 16 in the lineup sides of the upper section 6 which receive the ends of the spring contacts 10. By virtue of the assembly of the upper and lower insulating sections 6 and 7, the individual spring contacts 10 are, by means of the protrusions 15, deflected toward the inside into the contact chambers 16. This deflection is so dimensioned that, in the terminal position provided after assembly, the spring contacts 10 will be erected shortly before plastic deformation.

By means of the first contacting process, when lining up module 2, or also by means of a special subsequent calibration process, the elasticity limit of the contacts can be exceeded so that the individual contacts will be elastically deformed in their end contact areas. Thus, all individual spring contacts are brought to the same initial stress or tension. Contact force fluctuations caused by the position and dimension tolerances of the spring contact and the insulating sections are thus minimized.

In an alternate embodiment, provision is made to bring the bottom portions 4—which adjoin each other in the lineup—of neighboring modules 2 into contact not only electrically but also mechanically. For this purpose guides 17, 18 in the upper insulating section 6 are provided. These guides have engagement profiles, such as T-profiles, L-profiles, dovetail profiles and the like, and are made so that they fit with each other in a complementary fashion at the two lineup sides, as shown in FIG. 4. That is, the T-shaped guide 17 is on one side of the section 6 and the corresponding T-groove guide 18 is on the other side. By means of the guides 17, 18, the contact forces between the bottom portions 4 of adjoining modules 2 can be accommodated. If higher contact forces are expected, then the guides can also be metallic stamped in order to be able to absorb correspondingly higher forces. Guides 17, 18 furthermore serve to determine the precise position of the adjoining bottom portions 4 of the modules 2 so that tolerance fluctuations in the bottom portion area will not have a disadvantageous effect on the positioning of the other parts of neighboring modules.

In another practical design shown more particularly in FIGS. 2 and 3, the individual spring contacts 10, on their two contact portions, have contact areas 19 and 20 which have different shapes. Specifically, on one end the spring contacts have a roughly circular contact area 19 while on the other end, a flat contact area 20 is provided. As a result of this design, reliable contacting for the desired contact connections between adjacent module bottom portions is provided which can also accommodate level or height differences between neighboring module bottom portions 4 caused by production and position tolerances.

Referring once again to FIG. 1, the module bottom portion 4 is inserted between two identical frame halves or shells 21 which protrude upwardly and which are connected together. In order to line neighboring modules 2 up next to each other, there are provided on the frame shells 21 guide pieces 22 for precentering and rough guidance, with precise positioning being accomplished by the guides 17, 18 on the bottom portions 4 as set forth above.

In this design, the upper portions 5 of the modules essentially comprise only one cover plate 23 and conductor plates 24 which are attached thereto and which receive the circuitry and all of the switching elements. The plates 24 are mechanically and electrically connected with the other element of the plug connection of the bottom portion 4. That is, the upper portion 5 has a plug part 25 which is connected to the socket bar 12 of the lower portion. Handle pieces 26 are also connected with the cover plate 23 as are connectors 27 for connection of external wiring.

In the frame shells 21, there are also provided guides (not shown) for the accurate insertion of the upper portion 5, and specifically the conductor plate 24. In this fashion, the plug part 25 can be precisely inserted into the socket bar 12.

Because in the version illustrated in FIG. 1, the frame shells 21 overlap the contact-transmitting sides of the bottom portions 4, the frame shells 21 contain openings 28 for the contact sectors of the spring contact springs 10. Finally, the bottom portions 4 also carry the customary assembly feet (not shown), which are either molded on the underside of the portions or are fastened thereto as separate parts for the purpose of being placed upon the carrier rails 3.

It is also possible to make the upper portions of the modules as compact boxes provided with their own housing. These boxes then have foot-like guide pieces or the like on the underside thereof which engage corresponding recesses in the bottom portions and which can be made to rest therein. In this kind of design, the bottom portions are then not provided with frame shells.

With the present invention, there is provided a strict separation between the current supply, which is associated only with the bottom portions 4, and the circuitry for the control of the equipment or machine elements. Because of the lining-up of the bottom portions via the contacts, a current supply line in the manner of a bus line for the modules of this line is obtained. The supply line is established by means of a contact connection. If, anywhere along the module line, a module upper portion is removed from any of the modules for the purpose of maintenance, exchange or repair of the circuitry therein, there is no interruption in the current supply to the other modules because the bottom portion of that particular module remains on the carrier rail and thus maintains the contact connection of the line of modules via its set of contacts. All modules that are not involved and thus, the machines and subassemblies controlled thereby, can continue to remain in operation.

This design furthermore offers the advantage that the buildup of the bus line for the current supply of the modules of a line can be accomplished in an extremely easy fashion and in a practical manner as one lines the modules up on a carrier rail. This is done automatically via the contact connections that are materialized in this fashion, without any additional need for the rather awkward handling of plug connections between the lined-up bottom portions when the elements are to be lined up with each other. The elimination of the plug connection elements between the adjacent modules, including the flat-strip cable pieces which have been required with the prior devices, increases the space available for other circuit elements and external wiring.

While in accordance with the provisions of the patent statute the preferred forms and embodiments have been illustrated and described, it will be apparent to those of ordinary skill in the art that various changes and modifications may be made without deviating from the inventive concepts set forth above.

What is claimed is:

1. A multiple signal transmission device for controlling equipment, comprising
   (a) a transmitter/receiver connected with a carrier rail;
   (b) at least one input/output module connected with said transmitter/receiver for transferring control signals relative to the equipment, said module including
      (1) a bottom portion connected with the carrier rail; and
      (2) a top portion electrically connected with said bottom portion via a plug connecting;
   (c) contact means connected with said module bottom portion and protruding laterally outwardly therefrom for engaging and electrically connecting said module bottom portion with a bottom portion of an adjacent module to provide current to said modules and data transfer therebetween, said contact means being electrically connected with said plug connection to supply current and transfer data relative to said module top portion.

2. A device as defined in claim 1, wherein said module bottom portion contains complementary guides on the sides thereof which engage the guides of an adjacent module to line up a plurality of modules on the carrier rail.

3. A device as defined in claim 1, and further comprising a pair of mutually linked frame halves surrounding said bottom portion and for receiving and retaining said module top portion to hold said module together as an assembly.

4. A device as defined in claim 3, wherein said frame halves each contain an opening for access to said end portions of said spring contacts.

5. A multiple signal transmission device for controlling equipment, comprising
   (a) a transmitter/received connected with a carrier rail;
   (b) at least one input/output module connected with said transmitter/receiver for transferring control signals relative to the equipment, said module including
      (1) a bottom portion connected with the carrier rail; and
      (2) a top portion electrically connected with said bottom portion via a plug connection; and
   (c) spring contacts connected with and passing through said module bottom portion between the contact lineup sides of said module for electrically connecting said module bottom portion with a bottom portion of an adjacent module to provide current to said modules and data transfer therebetween, said contact means being electrically connected with said plug connection to supply current and transfer data relative to said module top portion.

6. A device as defined in claim 5, wherein said module bottom portion includes upper and lower insulating sections, said upper section containing a plurality of recesses opposite said lower section for receiving said spring contacts.

7. A device as define in claim 6, wherein said spring contacts are initially interconnected via studs, and further wherein said module bottom portion upper section includes projections between said recesses for breaking said studs away from said spring contacts during assembly of said module.

8. A device as defined in claim 6, wherein said upper insulating section contains contact chambers in the opposite sides thereof and said lower insulating section contains protrusions on the opposite sides thereof for directing the ends of said spring contacts into an adjacent contact chamber during assembly and for pressing the ends of said contacts into an erect position.

9. A device as defined in claim 8, wherein said lower section protrusions are configured to press said spring contacts into said chambers to an extent wherein said contacts are retained in an erect position without diminishing their elasticity.

10. A device as defined in claim 7, wherein one end portion of said spring contacts has a flat contact surface and the other end portions of said spring contact has a curved contacts surface.

* * * * *